United States Patent
Opris

[19]

[11] Patent Number: 6,130,632
[45] Date of Patent: Oct. 10, 2000

[54] DIGITALLY SELF-CALIBRATING CURRENT-MODE D/A CONVERTER

[75] Inventor: Ion E. Opris, Cupertino, Calif.

[73] Assignee: National Semiconductor Corporation, Santa Clara, Calif.

[21] Appl. No.: 09/062,157

[22] Filed: Apr. 16, 1998

[51] Int. Cl.[7] .................................................. H03M 1/10
[52] U.S. Cl. .......................... 341/120; 341/121; 341/144
[58] Field of Search ................................... 341/120, 121, 341/144

[56] References Cited

U.S. PATENT DOCUMENTS

| | | | |
|---|---|---|---|
| 4,344,067 | 8/1982 | Lee | 340/347 |
| 4,947,172 | 8/1990 | Suzuki | 341/145 |
| 5,446,455 | 8/1995 | Brooks | 341/145 |
| 5,642,116 | 6/1997 | Gersbach | 341/120 |
| 5,646,619 | 7/1997 | Daubert et al. | 341/118 |
| 5,825,317 | 10/1998 | Anderson et al. | 341/120 |
| 5,870,044 | 2/1999 | Dell'ova et al. | 341/120 |
| 5,955,980 | 9/1999 | Hanna | 341/120 |

OTHER PUBLICATIONS

"A True 16b Self–Calibrating BICMOS DAC", Analog Devices, Inc., Wilmington, MA.
"A Self–Calibration Technique for Monolithic High–Resolution D/A Converters", IEEE Journal of Solid–State Circuits, vol. 24, No. 6, Dec. 1989.

*Primary Examiner*—Brian Young
*Assistant Examiner*—Jason L. W. Kost
*Attorney, Agent, or Firm*—Limbach & Limbach L.L.P.; Seong-Kun Oh

[57] ABSTRACT

Digital self-calibration of digital-to-digital converters includes an approach to correct for the arbitrary errors in the analog section provided that there are sufficient redundancy in the architecture. The calibration procedure is performed off-line (upon power-up or user request). The digital correction technique avoids the need of a very accurate current mirror or an extra digital-to-analog converter as a standard transfer device.

23 Claims, 4 Drawing Sheets

DIGITALLY SELF-CALIBRATING CURRENT-MODE D/A CONVERTER

BACKGROUND OF THE INVENTION

1. Field of the Invention

The present invention relates to digital-to- analog (D/A) converters. More particularly, the present invention relates to methods and apparatus for digital calibration of D/A converters.

2. Description of the Related Art

The most widely used D/A converters are of switched current type (current-mode) because of their operating speed and size. A current-mode D/A converter includes an N binary scaled current sources (for example, current cells) and associated switches. FIG. 1 illustrates a conventional current mode D/A converter current cell. As shown, switch $S_1$ connects current I to a common summing node $N_S$ for a corresponding data bit $D_i$ of a "1" to provide a current cell output current $I_i$ along a signal output line current_out, while a second switch $S_2$ steers the current I to a ground node GND for a data bit $D_i$ of a "0". In a differential D/A converter cell, switch $S_2$ is connected to a complementary output node $N_C$ as shown in FIG. 2.

The total output current $I_{OUT}$ of the current mode D/A converter is then determined by a sum of each of the output currents $I_i$ of the N current cells in the D/A converter as shown by the following expression.

$$I_{out} = \sum_{i=1}^{N} D_i \cdot I_i \quad (1)$$

where N is the number of current cells in the current mode D/A converter architecture, and further, where each current cell corresponds to a current cell output current $I_i$ for a corresponding data bit $D_i$.

As can be seen from equation (1), the total output current $I_{out}$ of the current mode D/A converter is an accurate analog equivalent of the binary input code $D_i$, provided that the individual current cells $I_i$ are binary scaled and highly accurate.

For D/A converters with a large number of bits, the required accuracy can be obtained by trimming. The cost of the manufacturing for the trimming process and the associated circuit and/or process complexity (such as non-volatile memory) are primarily responsible for the development of self-calibrated converters. Self-calibration methods using dynamic analog calibration is discussed in Groeneveld, D. W. J, et al., "A self-calibration technique for monolithic high resolution D/A converters", IEEE Journal of Solid-State Circuits, vol. SC-24, No. 6, pp. 1517–1522, December 1989. Additionally, a fully static self-calibrated converter and calibration method is discussed in Miller, et al., "A true 16 b self-calibrating BiCMOS DAC", Proceeding of IEEE International Solid-State Circuits Conference—ISSCC '93, pp 58–59, 263, February 1993.

The Miller approach uses an extra D/A converter to correct for the non-ideal characteristics of the main D/A converter, but the range of correction is limited by the sub-D/A converter complexity and the calibration method cannot adjust the full scale gain errors.

SUMMARY OF THE INVENTION

In view of the foregoing, a self-calibrated D/A architecture with digital calibration and correction algorithm is disclosed. According to the present invention, the digital correction technique avoids the need of a very accurate current mirror or an extra comparator D/A converter as a standard transfer device.

An apparatus including a current cell for a digitally self-calibrating current-mode digital-to-analog converter in accordance with one embodiment of the present invention includes a reference signal generator configured to provide a reference signal; a signal output terminal; a signal comparison terminal; a reference terminal; a first conversion switch coupled between said signal generator and said signal output terminal; a second conversion switch coupled between said signal generator and said reference terminal; and a calibration switch coupled between said signal generator and said signal comparison terminal; wherein said first conversion switch, said second conversion switch and said calibration switch selectively couple said signal generator to at least one of said signal output terminal, said signal comparison terminal and said reference terminal, and in accordance thereto, provide an output signal.

An apparatus including a digitally self-calibrating current mode digital-to-analog converter in accordance with another embodiment of the present invention includes an encoder configured to receive an input signal and in accordance thereto generate an encoded signal; an output terminal; an output switch coupled to said output terminal; a calibration switch; a reference signal switch coupled to said calibration switch and said output switch; a reference signal generator coupled to said reference signal switch configured to generate a reference signal; a calibration engine coupled to said encoder configured to generate a plurality of correction coefficients; a plurality of current cells each coupled to said calibration engine, each of said current cells configured to receive said plurality of correction coefficients and in accordance thereto, generate a first and second current cell signals; a comparator having a first input terminal, a second input terminal and a comparator output terminal, said first input terminal coupled to said calibration switch, said second input terminal coupled to said plurality of current cells, and said comparator output terminal coupled to said calibration engine, said comparator configured to receive said first and second current cell signals and to selectively receive said reference signal and in accordance thereto provide a comparator output signal to said calibration engine; and a controller coupled to said encoder, said reference signal switch, said calibration switch, said output switch and said calibration engine, configured to generate one or more control signals; wherein said comparator receives said reference signal in accordance with the switching of said calibration switch and said reference signal switch, and in accordance with generate a compared signal; and further wherein said output switch selectively provides an output signal to said output terminal in accordance with said one or more control signals.

An apparatus including a current mode comparator for a digitally self-calibrating current mode digital-to-analog converter in accordance with still another embodiment of the present invention includes a first input terminal configured to receive a first input signal; a second input terminal configured to receive a second input signal; an output terminal configured to provide an output signal, said output terminal coupled to said second input terminal; a reference terminal; a first transistor having a first terminal, a second terminal and a third terminal, said third terminal coupled to said reference terminal; a second transistor having a first terminal, a second terminal and a third terminal, said third terminal coupled to said reference terminal and said second transistor second terminal coupled to said first transistor second terminal; and a plurality of switches coupled between said first input terminal, said second input terminal and said first and second transistor first terminals; wherein said plurality of switches selectively couple said first and second input terminals to said first and second transistor first terminals and in accordance thereto providing a comparator output signal to said output terminal such that the current density of said first and second transistors are substantially constant.

A method of digitally self-calibrating a current mode digital-to-analog converter including a plurality of current cells in accordance with yet another embodiment of the present invention includes the steps of initializing a plurality of memory locations with an initialization factor; calibrating each of a plurality of current cells with a first calibration factor and in accordance thereto generating a plurality of correction coefficients, each of said correction coefficients corresponding to one of said current cells; calibrating said correction coefficients in accordance with a second calibration factor and storing each of said calibrated correction coefficients in said respective memory locations; and normalizing said plurality of calibrated correction coefficients in accordance with a normalization factor and in accordance thereto generating an output signal.

A method of performing digital correction for a current mode digital-to-analog converter including N current cells where N is an integer in accordance with a further embodiment of the present invention includes the steps of, for each $i^{th}$ current cell, where i=1 to N: receiving an input digital signal; comparing said input digital signal to a corresponding $i^{th}$ correction coefficient; if said input digital signal is larger than said corresponding $i^{th}$ correction coefficient, generating a first output digital signal and subtracting said $i^{th}$ correction coefficient from said input digital signal to generate an input digital signal for $(i+1)^{th}$ current cell; and if said input digital signal is not larger than said corresponding $i^{th}$ correction coefficient, generating a second output digital signal.

These and other features and advantages of the present invention will be understood upon consideration of the following detailed description of the invention and the accompanying drawings.

DESCRIPTION OF THE PREFERRED EMBODIMENT

Figure 1:
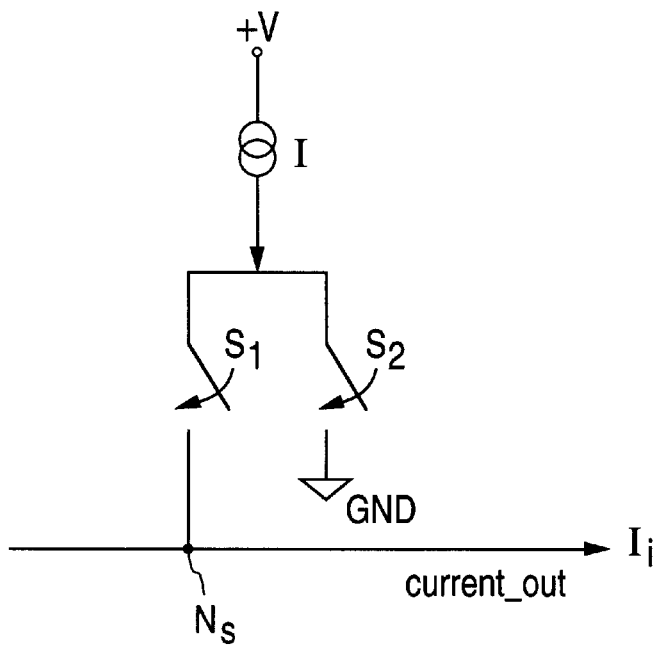
FIG. 1 illustrates a conventional D/A converter current cell.
Figure 2:
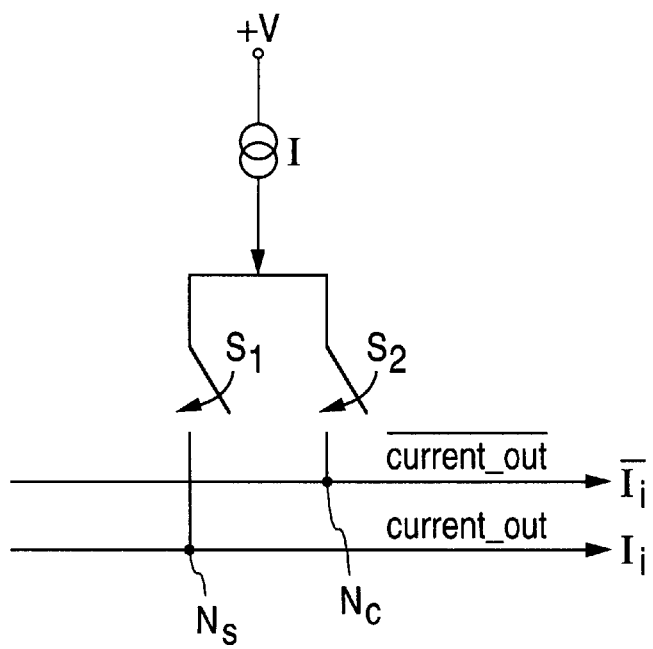
FIG. 2 illustrates a conventional differential D/A current cell.
Figure 3:
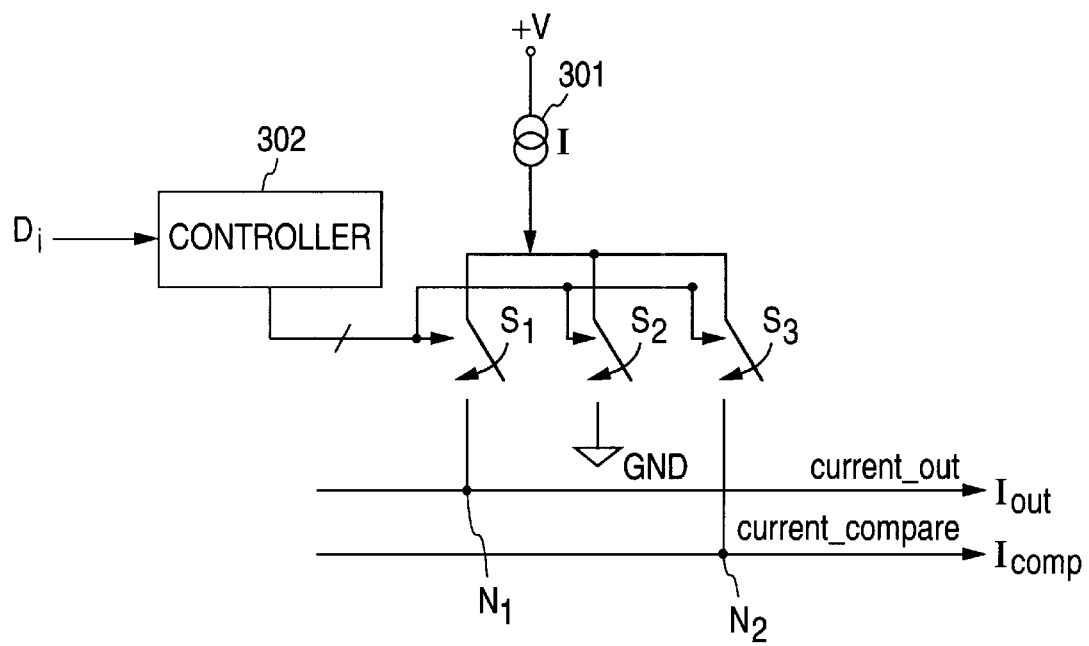
FIG. 3 illustrates a current-mode D/A converter current cell in accordance with one embodiment of the present invention.

FIG. 3 illustrates a current-mode D/A converter current cell in accordance with one embodiment of the present invention. As shown, there are provided three switches $S_1$, $S_2$ and $S_3$ coupled in parallel to a current source 301. There are also provided two common lines current_out, current_compare and a reference terminal such as a ground terminal GND. Also shown in FIG. 3 is a controller 302 which controls the switching of the three switches $S_1$, $S_2$ and $S_3$. The controller 302 receives the encoded digital data $D_i$ (for i=1 through N) from an encoder (FIG. 5) based on the input signal provided to the encoder, and accordingly generate one or a plurality of control signals which govern the switching logic of the three switches $S_1$, $S_2$ and $S_3$.

As can be seen from FIG. 3, switch $S_1$ is configured to couple the current source 301 to a first node $N_1$ to provide a current I from the current source 301 to the common line current_out, while switch $S_3$ is configured to couple the current source 301 to a second node $N_2$ to provide the current I from the current source 301 to the common line current compare. Moreover, switch $S_2$ is configured to couple to the reference terminal GND. The operation of the three switches $S_1$, $S_2$ and $S_3$ is illustrated in Table 1 below.

TABLE 1

Switching State During Conversion/Calibration

| Operation State/<br>Data bit $D_i$ | Switch $S_1$ | Switch $S_2$ | Switch $S_3$ |
|---|---|---|---|
| Conversion/$D_i$ = 1 | X | O | O |
| Conversion/$D_i$ = 0 | O | X | O |
| Calibration | O | O | X | where "X" indicates that the switch is in a closed position and "O" indicates that the switch is in an open position.

Figure 5:
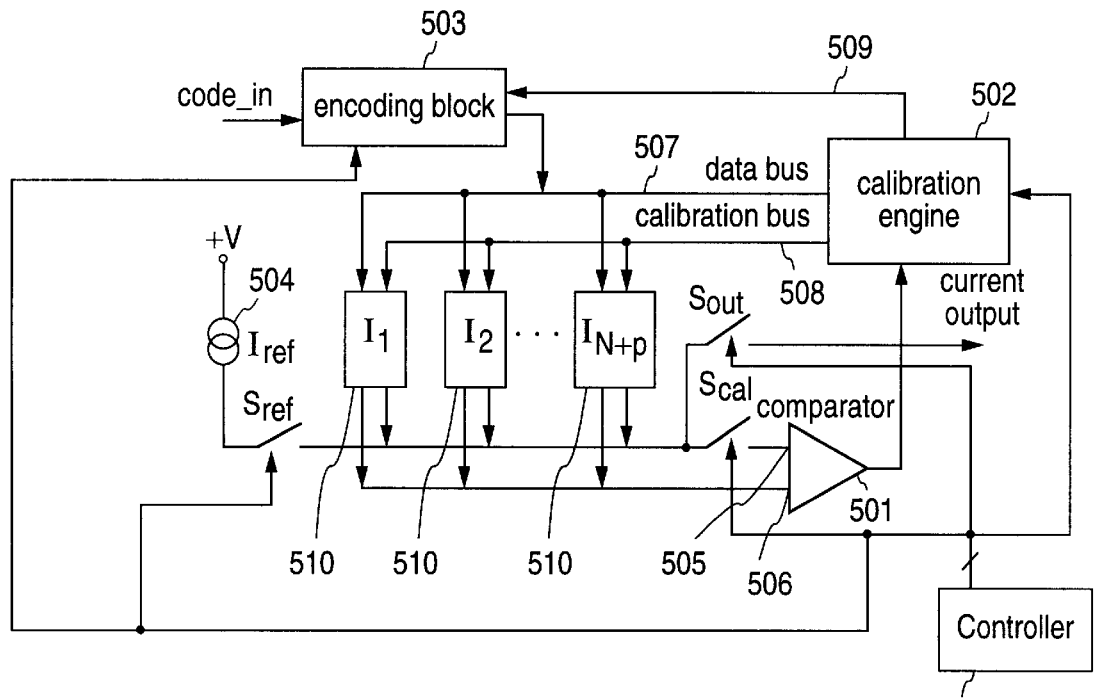
FIG. 5 illustrates a block diagram of the self-calibrating D/A converter in accordance with one embodiment of the present invention.

As can be seen from Table 1 above, during the digital to analog conversion operation, switch $S_3$ is turned off and switches $S_1$ and $S_2$ operate in accordance with the value of the respective data bit $D_i$ to provide an output analog signal $I_{OUT}$ corresponding to the data bit $D_i$. On the other hand, during the calibration stage, the third switch $S_3$ is configured to provide the current I to the common line current_compare, and accordingly, provide a calibration signal $I_{comp}$ to a current-mode comparator 501 (FIG. 5). As can be seen, switch $S_3$ is activated only during the calibration stage. The calibration operation will now be described.

Figure 4:
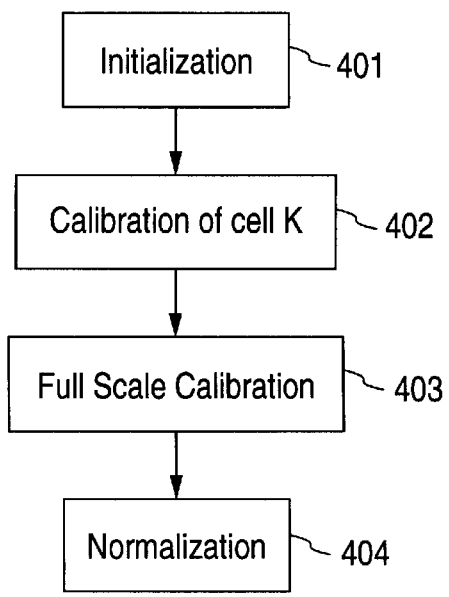
FIG. 4 illustrates a flow chart for a current mode D/A converter calibration in accordance with one embodiment of the present invention.

FIG. 4 illustrates a flow chart of the digital calibration operation in accordance with one embodiment of the present invention. Memory locations mem(i) (not shown) are provided for each associated current mode D/A converter cell k, and are configured to store a respective corresponding correction coefficient. Furthermore, when one of the current mode D/A converter current cells k is in calibration operation, all of the remaining current cells k are in a normal D/A conversion operation.

At step 401, memory locations mem(i) are initialized to "1." After initialization, each of the current mode D/A converter current cells k is calibrated at step 402 where the total number of D/A converter current cells k ranges from 2 to N+p with p being the number of extra current cells necessary for the required design precision and redundancy. At the calibration step 402, a calibration switch is turned on (for example, switch $S_3$ in the current cell of FIG. 3), providing a reference current I (for example, the current I from the current source 301 of FIG. 3) to the current_compare line. Using a successive approximation procedure (which is faster than a linear search), a calibration engine 502 (FIG. 5) calculates the correction coefficients for storing in the respective memory locations mem(k) in accordance with the following expression:

$$mem(k) = \max\left\{\sum_{i=1}^{k-1} D_i \cdot mem(i)\right\} + 1 \qquad (2)$$

where max is an operation with data bit Di inputs to determine the maximum value such that the following expression is satisfied:

$$\sum_{i=1}^{n-1} D_i \cdot I_i < I_k \qquad (3)$$

While equation (3) ensures the system's linearity, since the least significant bit (LSB) value is assumed to be ideal in step 402, a full scale calibration must be performed. Accordingly, at step 403, an external reference current IREF corresponding to the full scale value is introduced into the common line current compare which is coupled to the current-mode comparator 501 (FIG. 5). Using the same successive approximation as in step 402, a corresponding output code coderef is obtained in accordance with the following expression:

$$coderef = \max\left\{\sum_{i=1}^{N+p} D_i \cdot mem(i)\right\} + 1 \qquad (4)$$

where again, the max operation with data bit Di inputs determines the maximum value such that the following expression holds:

$$\sum_{i=1}^{N+p} D_i \cdot I_i < I_{ref} \qquad (5)$$

Finally, at step 404, all of the correction coefficients stored in the respective memory locations mem(k) obtained from step 402 are normalized in accordance with the following expression:

$$mem(i) \leftarrow \frac{2^N \cdot mem(k)}{coderef} \qquad (6)$$

This normalization step ensures that the output code coderef obtained from equation (4) corresponds to the full scale digital representation $2^N$ Furthermore, to avoid large errors due to truncation, all arithmetic operations are performed with precision of at least 2 bits more than the internal representation.

As described above, in accordance with the present invention, each current cell current $I_i$ starting with the LSB (which is assumed to be ideal) is calibrated against the previously calibrated current cell current $I_{i-1}$ from each respective current cells k. The calibration is performed in units of LSB for the D/A converter core, which is a fraction of the overall D/A converter LSB (usually ¼ LSB).

Therefore, in accordance with the present invention, the calibration algorithm corrects for arbitrary errors in the analog section of the current mode D/A converter as long as there is enough redundancy. Furthermore, the calibration procedure is performed off-line, for example, at power-up or at the request of the user.

FIG. 5 illustrates a current-mode D/A converter in accordance with one embodiment of the present invention. As shown, there are provided a current-mode comparator 501, a calibration engine 502 configured to receive the output of the current-mode comparator 501, and an encoding block 503 for receiving the input digital signal code_in, and, accordingly, for providing digital bits $D_1$–$D_N$. Also shown in FIG. 5 is a reference signal source 504 for providing a reference signal $I_{REF}$ to a first input terminal 505 of the current-mode comparator 501 in accordance with the switching of a reference signal switch $S_{REF}$ coupled therebetween.

Also coupled to the first input terminal 505 is a calibration switch $S_{CAL}$ which is configured to couple outputs from the current_compare lines of each of the current cells 510 to the first input terminal 505 of the comparator 501 during the calibration stage. There is also provided a controller 511 which receives the encoded digital bits $D_1$–$D_N$, and accordingly, generates control signals for controlling the switching of the reference signal switch $S_{REF}$, the calibration switch $S_{CAL}$, the output switch $S_{OUT}$, as well as the calibration engine 502 during the calibration stage. There is further provided a path 509 for coupling the calibration engine 502 to the encoding block 503 for storing the correction coefficients during the calibration stage at the respective memory locations mem(i) in the encoding block 503.

FIG. 5 also shows a plurality of current cells 510 coupled to the calibration engine 502 by a data bus 507 and a calibration bus 508. Upon initiation from the calibration engine 502, each of the current cells 510 are configured to receive a corresponding input data Di as well as the corresponding correction coefficient, and accordingly, to output the output analog signal $I_{OUT}$ (FIG. 3) for each current cell 510 to the first input terminal 505, and to output the calibration signal $I_{comp}$ to the second input terminal 506 of the current-mode comparator 501. Finally, there is provided an output switch $S_{OUT}$ coupled to the calibration switch $S_{CAL}$ to provide the output signal of the D/A converter.

Accordingly, the calibration in accordance with the present invention is controlled by the calibration engine 502 (FIG. 5), which can be implemented either as a dedicated state machine or a programmed micro-controller. The calibration procedure only needs to be performed once at power up.

Figure 6:
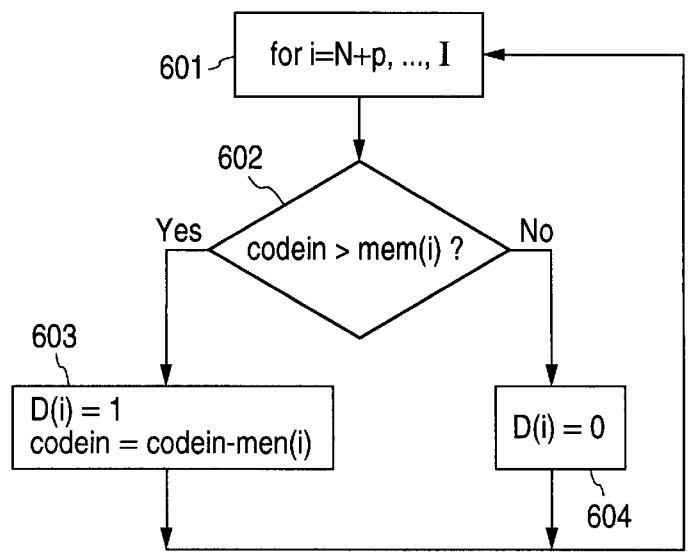
FIG. 6 illustrates a flow chart for digital correction of a current-mode D/A converter in accordance with one embodiment of the present invention.

FIG. 6 illustrates digital correction in accordance with one embodiment of the present invention. As shown, at step 601, an iterative loop is established for a variable i from 1 to (N+p). At step 602, it is determined whether the input digital code codein (to be converted into analog domain) is larger than the corresponding correction coefficient stored in the respective memory location mem(i). If at step 602 it is determined that the input digital code codein is larger than the corresponding correction coefficient stored in the respective memory location mem(i), then the digital data Di is set to "1" at step 603, and the value of the corresponding correction coefficient stored in the respective memory location mem(i) is subtracted from the input digital code codein for the next iterative step returning to step 601. However, if at step 602 the input digital code codein is determined not to be larger than the corresponding correction coefficient stored in the respective memory location mem(i), then digital data Di is set to "0" at step 604 and the same input digital code codein used for comparison at step 602 is returned to the beginning of the iterative loop at step 601.

This procedure is used to identify the data bits D(i) such that equation (1) is satisfied. In the digital domain, this is equivalent to the following expression:

$$codein = \sum_{i=1}^{N+p} D_i \cdot mem(i) \qquad (7)$$

Accordingly, the digital correction maps the input digital code codein into a suitable internal representation for all the current cells in the D/A converter core, $D_i$, i=1, ..., N+p. This mapping can be achieved algorithmically for each data sample. Alternatively, the mapping can be performed only once during the calibration cycle for all possible input codes (from 0 to $2^{N-1}$) and the results can be stored in a look-up table. The latter approach presents the advantage of speed but requires extra hardware for the look-up table, which can be implemented with a $2^N \times (N+p)$ bits wide RAM.

In order for the digital correction to operate properly, some redundancy in data bit resolution needs to be introduced into the system. There are two approaches for creating the redundancy. In accordance with a first approach, a radix r<2 between the current cells 510 is used. As such, if the relative error from the nominal value of the individual current $I_i$ from the current cells is limited by α (where α is the maximum relative error from the nominal value of the individual currents $I_i$), the radix r has to satisfy the following condition:

$$r \leq 2 \cdot (1-\alpha) \qquad (8)$$

Equation (8) ensures that the adjacent analog domain overlap. To obtain a global precision better than ¼ LSB (least significant bit), at least two extra current cells are added such that the smaller output increment is less than ¼ LSB.

The nominal values for the current sources $I_i$ in this D/A conversion core are given by the following equation:

$$I_{i+1} = rI_i \qquad (9)$$

for i=1,2, ..., N+p, and, where, as previously, p is the number of extra current cells necessary for precision and redundancy. Accordingly, very large relative errors can be corrected with a minimum number of extra current cells.

In accordance with the second approach, several current cells 510 in the converter are duplicated. The radix is maintained at a nominal value of 2 which provides the advantage of simplicity, easy implementation, scaling from stage to stage, and better matching properties. Accordingly, for a maximum relative error α from the nominal value of the individual current sources, the maximum number of current cells between any duplicated pair of current cells has to satisfy the following condition:

$$(1-\alpha) \cdot (3+2+4+\ldots+2^k) \geq (1+\alpha) \cdot 2^{k+1} \qquad (10)$$

which can alternatively be expressed as follows:

$$2^{k+2} \leq \frac{1-\alpha}{\alpha} \qquad (11)$$

Given a 10-bit D/A converter using 5-bit precision current sources (with, for example, a 3% relative error), the nominal values for the 14 stages in the conversion architecture are shown in Table 2 below. In this case, a maximum relative error of α=0.03 satisfies the design constraints within this architecture.

TABLE 2

Nominal Current Source Relative Values for a 10-bit D/A Converter.

| Bit# | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| $I_{NOM}$ | $2^0$ | $2^1$ | $2^2$ | $2^3$ | $2^4$ | $2^4$ | $2^5$ | $2^6$ | $2^7$ | $2^8$ | $2^8$ | $2^9$ | $2^{10}$ | $2^{11}$ |

For the above look-up table decoding technique (Table 2), the required memory size is 14 Kbit, which is 14*1 Kbit, where 1 Kbit is $2^{10}$ for a 10-bit line input and a 14-bit line output.

As an example, for each of the current mode D/A converter current cells with a relative error of 3% and a random sign, the Integral Non-Linearity (INL) is between +9 LSB and −17 LSB without correction. On the other hand, in accordance with the present invention, the INL can be reduced to less than ±0.35 LSB while the differential non-linearity (DNL) can be reduced to less than 0.5 LSB.

Figure 7:
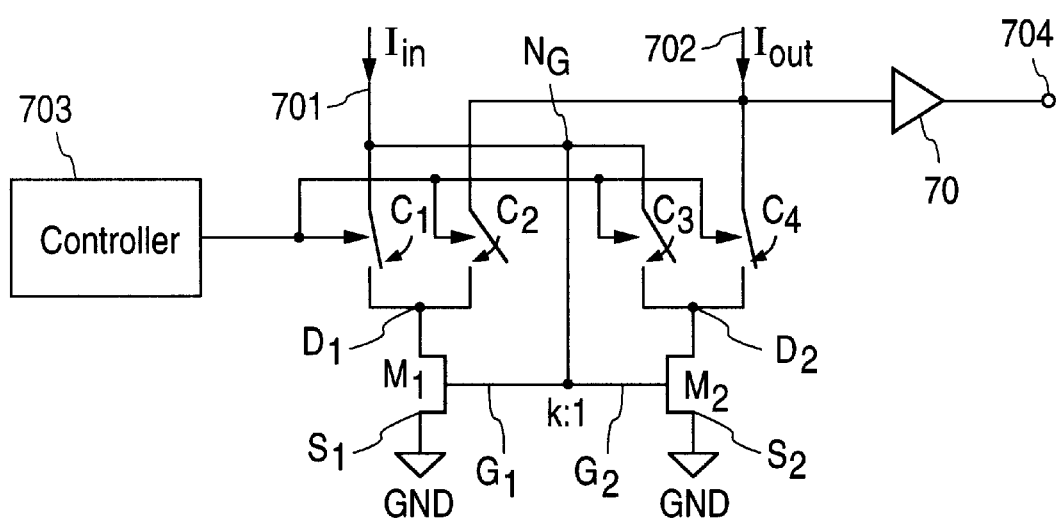
FIG. 7 illustrates a metal-oxide semiconductor (MOS) current-mode comparator in accordance with one embodiment of the present invention.

FIG. 7 illustrates a current mode comparator 501 (FIG. 5) in a MOS implementation in accordance with one embodiment of the present invention. As can seen from the Figures, the input terminals 505 and 506 for the comparator 501 (FIG. 5) corresponds to the two input terminals 701 and 702 of the MOS implementation as shown in FIG. 7.

As further shown in FIG. 7, there are provided two metal oxide semiconductor (MOS) transistors $M_1$ and $M_2$ coupled at the respective gate terminals $G_1$ and $G_2$, and each of whose drain terminals $D_1$ and $D_2$ are coupled to a pair of switches $C_1$, $C_2$, and $C_3$, $C_4$ respectively. The source terminals $S_1$ and $S_2$ of the two transistors $M_1$ and $M_2$ are coupled to a reference terminal (for example, a ground node GND). Also shown in FIG. 7 is a controller 703 is operates to selectively couple the four switches $C_1$–$C_4$, and accordingly, to provide the resulting signal to an output terminal 704 of the comparator via a buffer 70. The buffer 70 is provided to amplify the output signal of the comparator.

In this manner, a MOS current mirror is provided in which the two pairs of switches, $C_1$, $C_2$, and $C_3$, $C_4$, are configured to dynamically provide a first input signal $I_{in}$ and a second input signal $I_{out}$ to the drain terminals $D_1$ and $D_2$ of the two MOS transistors $M_1$ and $M_2$ as will be further explained below. Additionally, it can be seen from FIG. 7 that the gate terminals $G_1$ and $G_2$ of the two MOS transistors are coupled at a gate coupling node $N_G$ to receive the input current For each measurement involving the current comparator, two measurements meas1 and meas2 are actually taken, reversing the role of the transistors in the current mirror. The true value can be estimated by an average of the two measurements, meas1 and meas2. Furthermore, a first order correction can be obtained by a simple arithmetic average. In other words, to obtain the first comparator measurement meas1, switches $C_1$ and $C_4$ in FIG. 7 couples the first and second input signals $I_{in}$ and $I_{out}$ to the drain terminals $D_1$ and $D_2$ of transistors $M_1$ and $M_2$, respectively. In this manner, transistor $M_2$ is configured to mirror transistor $M_1$. To obtain the second comparator measurement meas2, switches $C_2$ and $C_3$ in FIG. 7 couples the first and second input signals $I_{in}$ and $I_{out}$ to the drain terminals $D_2$ and $D_1$ of transistors $M_2$ and $M_1$, respectively. In this manner, transistor $M_1$ is configured to mirror transistor $M_2$. It is to be further noted that the operation of the switches $C_1$–$C_4$ as described above are performed during the calibration stage of the D/A converter.

Accordingly, the transfer ratio does not have to be a constant over a wide dynamic range. For a case of the MOS current mirror as described above, the current ratio k is a function of the geometric and threshold mismatches between the mirror transistors $M_1$ and $M_2$, but it is reasonably close to one for an extremely wide dynamic range. Thus, by reversing the roles of the two transistors $M_1$ and $M_2$ by way of switches $C_1$–$C_4$ as described above, the current density in the transistors $M_1$ and $M_2$ remains effectively unchanged, thereby achieving a transfer ratio of 1/k.

Given the following expression:

$$k=1+\beta \tag{12}$$

the arithmetic average only has a second order error term as shown by the following expression:

$$\left(k+\frac{1}{k}\right)/2 \cong 1+\frac{\beta^2}{2} \tag{13}$$

If this error is still large compared with the D/A converter's LSB, the estimation can be refined by using the geometric mean as shown by the following expression:

$$\text{meas}=\sqrt{\text{meas1}\cdot\text{meas2}} \tag{14}$$

Moreover, the computation complexity of the root extraction can be avoided by a linear search algorithm. The estimation means refined by using the geometric means as shown in equation (14) is initialized with the arithmetic mean, and then successively decreased until the following expression is satisfied:

$$\text{meas}^2 < \text{meas1}-\text{meas2} \tag{15}$$

Further, for a higher output impedance, a cascoded current mirror can be used in the same manner. The approaches as disclosed above can also be applied to a voltage-output D/A converter implemented with a current-mode D/A and a current-to-voltage converter. In the present case, the voltage offset of the comparator can be accurately compensated by an arithmetic average of the two measurements performed with the input nodes reversed. Furthermore, since the MOS comparator in accordance with the present invention includes the current-to-voltage converter gain in the calibration loop, the advantages of the full scale correction are evident. Moreover, the digital correction approach in accordance with the present invention avoids the need for a very accurate current mirror or an extra D/A converter as a standard transfer device.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a current cell for a digitally self-calibrating current-mode digital-to- analog converter, comprising:

a reference signal generator configured to provide a reference signal;

a signal output terminal;

a signal comparison terminal;

a reference terminal;

a first conversion switch coupled between said signal generator and said signal output terminal;

a second conversion switch coupled between said signal generator and said reference terminal; and a calibration switch coupled between said signal generator and said signal comparison terminal;

wherein said first conversion switch, said second conversion switch and said calibration switch selectively couple said signal generator to at least one of said signal output terminal, said signal comparison terminal and said reference terminal, and in accordance thereto, provide an output signal.

2. The apparatus of claim 1 wherein said reference terminal is ground.

3. The apparatus of claim 1 further including a controller coupled to said first conversion switch, said second conversion switch, and said calibration switch, said controller configured to receive an input signal and in accordance thereto, generate one or more control signals.

4. The apparatus of claim 3 wherein said first conversion switch, said second conversion switch, and said calibration switch selectively couple said reference signal generator, said signal output terminal, said signal comparison terminal, and said reference terminal in accordance with said control signal.

5. The apparatus of claim 1 wherein during a first state, said signal generator is configured to couple to said signal comparison terminal, and further, during a second state, said signal generator is configured to couple to one of said reference terminal and said signal output terminal.

6. The apparatus of claim 5 wherein said first state is a calibration stage of said current cell and further, wherein said second state is a conversion stage of said current cell.

7. An apparatus including a digitally self-calibrating current mode digital-to-analog converter, comprising:

an encoder configured to receive an input signal and in accordance thereto generate an encoded signal;

an output terminal;

an output switch coupled to said output terminal;

a calibration switch;

a reference signal switch coupled to said calibration switch and said output switch;

a reference signal generator coupled to said reference signal switch configured to generate a reference signal;

a calibration engine coupled to said encoder configured to generate a plurality of correction coefficients;

a plurality of current cells each coupled to said calibration engine, each of said current cells configured to receive said plurality of correction coefficients and in accordance thereto, generate a first and second current cell signals;

a comparator having a first input terminal, a second input terminal and a comparator output terminal, said first input terminal coupled to said calibration switch, said second input terminal coupled to said plurality of current cells, and said comparator output terminal coupled to said calibration engine, said comparator configured to receive said first and second current cell signals and to selectively receive said reference signal and in accordance thereto provide a comparator output signal to said calibration engine; and a controller coupled to said encoder, said reference signal switch, said calibration switch, said output switch and said calibration engine, configured to generate one or more control signals;

wherein said comparator receives said reference signal in accordance with the switching of said calibration switch and said reference signal switch, and in accordance with generate a compared signal; and further wherein said output switch selectively provides an output signal to said output terminal in accordance with said one or more control signals.

8. The apparatus of claim 7 wherein said encoder is configured to receive and to store said correction coefficients from said calibration engine.

9. The apparatus of claim 8 wherein said encoder includes a memory having a plurality of memory locations for storing said correction coefficients.

10. The apparatus of claim 7 wherein said calibration engine is configured to provide a calibration signal to said plurality of current cells in accordance with said one or more control signals from said controller.

11. An apparatus including a current mode comparator for a digitally self-calibrating current mode digital-to-analog converter, comprising:

a first input terminal configured to receive a first input signal;

a second input terminal configured to receive a second input signal;

an output terminal configured to provide an output signal, said output terminal coupled to said second input terminal;

a reference terminal;

a first transistor having a first terminal, a second terminal and a third terminal, said third terminal coupled to said reference terminal;

a second transistor having a first terminal, a second terminal and a third terminal, said third terminal coupled to said reference terminal and said second transistor second terminal coupled to said first transistor second terminal; and a plurality of switches coupled between said first input terminal, said second input terminal and said first and second transistor first terminals;

wherein said plurality of switches selectively couple said first and second input terminals to said first and second transistor first terminals and in accordance thereto providing a comparator output signal to said output terminal such that the current density of said first and second transistors are substantially constant.

12. The apparatus of claim 11 wherein said reference terminal is a ground terminal.

13. The apparatus of claim 11 wherein said first and second transistors are MOS transistors.

14. The apparatus of claim 13 wherein said first and second transistors first terminals are drain terminals, said first and second transistors second terminals are gate terminals, and further, wherein said first and second transistors third terminals are source terminals.

15. The apparatus of claim 11 further including a buffer coupled between said output terminal and said second input terminal configured to amplify said output signal.

16. The apparatus of claim 11 further including a controller configured to provide comparator control signals to said plurality of switches, wherein said plurality of switches includes:

a first pair of switches configured to couple said first and second input terminals to said first and second transistors respectively, in accordance with a first comparator control signal; and a second pair of switches configured to couple said same first and second input terminals to said first and second transistors respectively, in accordance with a second comparator control signal.

17. The apparatus of claim 16 wherein said first and second comparator control signals are non- overlapping.

18. A method of digitally self-calibrating a current mode digital-to-analog converter including a plurality of current cells, said method comprising the steps of:

initializing a plurality of memory locations with an initialization factor;

calibrating each of a plurality of current cells with a first calibration factor and in accordance thereto generating a plurality of correction coefficients, each of said correction coefficients corresponding to one of said current cells;

calibrating said correction coefficients in accordance with a second calibration factor and storing each of said calibrated correction coefficients in said respective memory locations; and normalizing said plurality of calibrated correction coefficients in accordance with a normalization factor and in accordance thereto generating an output signal.

19. The method of claim 18 wherein said initialization factor is 1, wherein said first calibration factor includes a first reference signal, and further, wherein said second calibration factor includes a second reference signal.

20. The method of claim 18 wherein said memory locations include a random access memory.

21. A method of performing digital correction for a current mode digital-to-analog converter including N current cells where N is an integer, said method comprising the steps of:

for each $i^{th}$ current cell, where i=1 to N:

receiving an input digital signal;

comparing said input digital signal to a corresponding $i^{th}$ correction coefficient;

if said input digital signal is larger than said corresponding $i^{th}$ correction coefficient, generating a first output digital signal and subtracting said $i^{th}$ correction coefficient from said input digital signal to generate an input digital signal for $(i+1)^{th}$ current cell; and if said input digital signal is not larger than said corresponding $i^{th}$ correction coefficient, generating a second output digital signal.

22. The method of claim 21 wherein said first output digital signal is 1 and wherein said second output digital signal is 0.

23. The method of claim 21 further including the step of storing said N output digital signals.

* * * * *